United States Patent [19]

Davis

[11] 4,147,992

[45] Apr. 3, 1979

[54] AMPLIFIER CIRCUIT HAVING A HIGH DEGREE OF COMMON MODE REJECTION

[75] Inventor: William F. Davis, Tempe, Ariz.

[73] Assignee: Motorola, Inc., Schaumburg, Ill.

[21] Appl. No.: 864,176

[22] Filed: Dec. 27, 1977

[51] Int. Cl.² ............................................. H03F 1/34
[52] U.S. Cl. .................................. 330/288; 330/290; 330/293; 330/311
[58] Field of Search ............... 330/257, 258, 259, 260, 330/290, 288, 293, 310, 311

[56] References Cited

U.S. PATENT DOCUMENTS

| | | | |
|---|---|---|---|
| 3,366,889 | 1/1968 | Avins | 330/290 |
| 3,452,287 | 6/1969 | Büsch et al. | 330/300 X |

Primary Examiner—James B. Mullins
Attorney, Agent, or Firm—Maurice J. Jones, Jr.

[57] ABSTRACT

The disclosed unity gain amplifier circuit includes current supplies, current sinks, input, output and feedback transistors and an inverting gain stage. The negative feedback transistor stabilizes the quiescent signals and enables the magnitude of the amplifier output signal to follow the magnitude of the amplifier input signal. The gain stage, which is connected between the current supplies, the current sinks, and the input and feedback transistors, utilizes undesired signals occurring therein to cancel each other so that the undesired signals do not adversely effect the magnitude of the amplifier output signal.

10 Claims, 1 Drawing Figure

U.S. Patent
Apr. 3, 1979
4,147,992
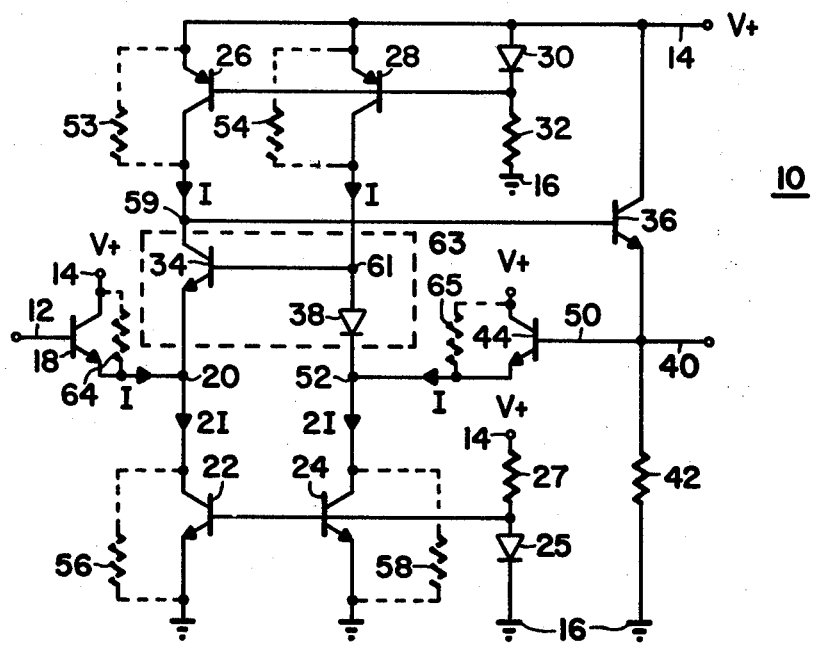

AMPLIFIER CIRCUIT HAVING A HIGH DEGREE OF COMMON MODE REJECTION

BACKGROUND OF THE INVENTION

There are many applications in modern day electronic equipment for amplifier circuits having a high degree of common mode rejection which diminishes the creation of unwanted signal components at the output terminals thereof. More specifically, such amplifiers are often desired for implementation in integrated circuit form for utilization in automotive applications. One such application relating to engine fuel control requires a stable, unity gain amplifier having a high input impedance and a high degree of common mode rejection. Such amplifiers must provide an output voltage having precisely the same magnitude as an analog input voltage occurring across a storage capacitor.

One prior art monolithic amplifier circuit configuration includes an NPN differential amplifier having two differential NPN transistors with a current source connected to the common emitters thereof. A further current source is connected to the collector of the output differential transistor and a further NPN transistor is connected between the further current source and the control electrode of the output differential transistor. This amplifier configuration meets the requirements of the previous paragraph except for the requirement relating to common mode rejection. More specifically, the internal impedances associated with the current sources and with the input differential transistor tend to cause undesired imbalance in the signals of the circuit. As the magnitude of the input voltage applied to the base of the input differential transistor increases, the voltage at the common emitter point of the differential transistor also increases. This produces a change in the magnitude of the current of the differential amplifier current source. Also, the driving voltage produces different changes in the magnitudes of the currents flowing through the input differential transistor and in the output current source. Since these changes in current magnitudes are not equal, the emitter current of the differential pair tends to undesirably change as a function of the change in the magnitude of the input voltage. As a result, the differential or common mode voltage across the differential amplifier changes as a function of the input voltage magnitude change thereby causing the magnitude of the output voltage of the amplifier to not precisely follow the magnitude of the analog input voltage as required.

Another prior art circuit utilizes a differential amplifier including inside and outside pairs of PNP transistors. A current source is connected to the emitters of the inside pair of PNP transistors. A differential-to-single ended converter including a diode and a NPN transistor is connected between the collectors of the inside pair of PNP transistors. An output NPN transistor is connected between the converter and the output differential amplifier transistor. The differential-to-single ended converter tends to force the emitter currents of the inside pair of differential transistors to be equal independent of the value of the current of the current source. The inside pair of differential transistors maintains balance in the outside pair of PNP transistors. Thus, the PNP differential amplifier provides a high degree of common mode rejection.

However, the foregoing prior art PNP differential amplifier tends to have relatively high input currents because of the low betas of the PNP transistors, which can undesirably load the driving circuit. This problem is particularly troublesome if the circuit is fabricated in monolithic integrated circuit form. Such loading can be disadvantageous, for example, if the driving circuit includes a storage capacitor having an analog voltage of a precise magnitude stored thereon since the loading will change the magnitude of the analog voltage. Furthermore, this PNP amplifier tends to limit the excursion of the output voltage thereof because of the base-to-emitter junction drops of the transistors connected between its output terminal and the positive power supply conductor. However, the most serious disadvantage is that this amplifier has two stages of gain which tend to oscillate when the amplifier is connected in a unity gain configuration. Therefore, large compensation capacitors are required to prevent oscillation. Such capacitors on the monolithic integrated circuit are costly or if provided externally will require additional pin-outs which increase the costs associated with the manufacture and use of the integrated circuit.

SUMMARY OF THE INVENTION

One object of the invention is to provide a simple amplifier circuit having a high degree of common mode rejection capability.

Another object is to provide a stable amplifier circuit suitable for manufacture in integrated circuit form which has a high degree of common mode rejection capability, high input impedance and which is stable enough for connection in a unity gain configuration without requiring a large on chip compensation capacitance.

In brief, the amplifier circuit of one embodiment provides an output signal at an output terminal thereof having a magnitude which precisely follows the magnitude of an input signal at an input terminal thereof. The amplifier circuit configuration includes first and second current supplies and a signal cancellation circuit. The first current supply is coupled to the output terminal of the amplifier and causes a first undesired signal which tends to adversely effect the magnitude of the amplifier output signal. The second current supply is also coupled to the amplifier output terminal and causes a second undesired signal which tends to adversely effect the magnitude of the amplifier output signal. The signal cancellation circuit has one terminal coupled to the first current supply and another terminal coupled to the second current supply. The signal cancellation circuit utilizes the first and second undesired signals to cancel each other so that they do not adversely effect the magnitude of the amplifier output signal.

BRIEF DESCRIPTION OF THE DRAWINGS

The sole FIGURE is a schematic diagram of an amplifier circuit of one embodiment of the invention.

DETAILED DESCRIPTION OF THE PREFERRED EMBODIMENTS

Amplifier circuit 10 of FIG. 1, which can be provided in either discrete or monolithic form, has an input terminal 12, a positive supply conductor 14 and a negative supply or ground conductor 16. NPN input transistor 18 includes a base electrode connected to input terminal 12, a collector electrode connected to positive supply conductor 14 and an emitter electrode connected to circuit node 20. NPN current sink transistors 22 and 24 have base electrodes connected together and to the anode electrode of bias diode 25. Resistor 27 is connected between the anode of diode 25 and positive power supply conductor 14. The emitter electrodes of transistors 22 and 24 and the cathode of diode 25 are all connected to negative supply conductor 16. Transistors 22 and 24 are designed to have matched electrical characteristics. Diode 25 provides equal bias to transistors 22 and 24 in response to the current through resistor 27.

PNP current source or supply transistors 26 and 28 have emitter electrodes which are connected to supply conductor 14, base electrodes which are connected together and to the cathode of bias diode 30. Resistor 32 is connected between the cathode of diode 30 and the negative supply conductor 16. The emitter electrodes of transistors 26 and 28 and the anode of diode 30 are all connected to positive power supply conductor 14. Transistors 26 and 28 are designed to have matched electrical characteristics. Diode 30 provides equal bias to current source transistors 26 and 28.

Gain stage NPN transistor 34 includes a collector electrode connected to the collector electrode of current supply transistor 26 and to the base electrode of output transistor 36. Transistor 34 also includes an emitter electrode connected to the collector electrode of current sink transistor 22 and a base electrode connected to both the collector electrode of current supply transistor 28 and to the anode of diode 38. NPN output transistor 36 includes a collector electrode which is connected to power supply conductor 14 and an emitter electrode which is connected to output terminal 40 of amplifier 10, to one terminal of resistor 42 and to the base electrode of feedback transistor 44. The emitter electrode of NPN transistor 44 is connected to the cathode electrode of diode 38 and to the collector electrode of current sink transistor 24. The collector electrode of transistor 44 is also connected to positive power supply conductor 14. Transistors 18 and 44 are designed to have the same electrical characteristics as each other.

QUIESCENT OPERATION

Current source or supply transistors 26 and 28, which have similar geometries and structures, are each biased by diode 30 and resistor 32 to provide constant currents having a predetermined magnitude of I. The value of resistor 27 and the geometries and structures of current sink transistors 22,, 24 and diode 25 are arranged so that current sink transistor 22, which is connected to the emitters of transistors 18 and 34, and current sink transistor 24, which is connected to the cathode of diode 38 and the emitter electrode of transistor 44, each draw a current having a magnitude of 2I. Thus, input transistor 18 and feedback transistor 44 each also conduct a quiescent current of I.

The base-to-emitter junctions of NPN transistors 18, 34 and 44 and the junction of diode 38 are all designed to have similar areas and electrical characteristics. Since currents of the same magnitude (I) flows through all of these junctions, the base-to-emitter junction voltages ($\phi$) of these devices are all substantially equal.

Consequently, amplifier output terminal 40 tends to have the same quiescent potential as input terminal 12. In particular, the base-to-emitter junction of transistor 18 drops the input bias voltage by its base-to-emitter junction voltage ($\phi$), transistor 34 then raises the voltage at node 20 by its base-to-emitter junction voltage ($\phi$), diode 38 then drops the voltage at the base of transistor 34 by its anode-to-cathode junction voltage ($\phi$), and transistor 44 raises the voltage at node 52 by the amount of its base-to-emitter junction voltage ($\phi$).

Transistor 44 provides negative feedback which tends to stabilize the quiescent voltage. If the voltage at terminal 40 undesirably decreases, then the voltage across resistor 42 decreases. Consequently transistor 44 becomes less conductive. Thus, diode 38 shunts more of the current from the base of transistor 34 to satisfy sink transistor 24. Transistor 34 then becomes less conductive which increases the collector voltage thereof. Transistor 36 responds by providing more current to resistor 42 and to the load.

The input currents of amplifier 10 can be arranged to have low magnitudes by causing the currents in amplifier 10 to have low magnitudes. In addition, the use of NPN input transistors with conventional IC fabrication techniques also helps to reduce the input current. Thus, circuit 10 can be arranged to provide minimal current drain from the power supply connected across conductors 14 and 16 and minimal input bias current loading.

INPUT IMPEDANCE

Since NPN transistor 18 has a relatively high beta as compared to a monolithic PNP transistor, amplifier 10 provides a higher input impedance than monolithic amplifiers having PNP input transistors for a given amplifier bias current. Thus circuit 10 does not undesirably load a driver circuit connected to input terminal 12. This high input impedance is particularly important if a storage capacitor, for instance, having a precision analog control voltage developed thereacross is connected between input terminal 12 and ground. Such capacitors are used in automotive circuitry associated with engine fuel control, for instance.

DYNAMIC OPERATION

As a dynamic signal voltage of increasing magnitude is applied to amplifier input terminal 12, transistor 18 is rendered more conductive thereby supplying a current having a greater magnitude than I. Consequently, transistor 34 supplies a current having a magnitude of less than I because transistor 22 will not sink current having a magnitude greater than 2I. The collector voltage of transistor 34 increases in response to transistor 34 becoming less conductive. Thus transistor 36 is rendered more conductive thereby providing more current to the load which is connected to amplifier output terminal 40. Consequently, the magnitude of the voltage cross the load also increases.

If the magnitude of the load voltage tends to increase more than the magnitude of the voltage at terminal 12, then transistor 44 is rendered more conductive thereby supplying a current having greater magnitude. Consequently, diode 38 conducts a current having a lower magnitude since transistor 24 will only sink a current of 2I. As a result, current from current supply 28 is diverted into the base of transistor 34 which renders transistor 34 more conductive thereby reducing the drive to transistor 36 which becomes less conductive and equalizes the magnitudes of the input and load voltages. Therefore, transistor 44 provides negative feedback which causes the magnitude of the voltage at output terminal 40 to be equal to and to precisely follow the magnitude of the voltage at terminal 12. Thus, transistor 44 enables amplifier 10 to have unity voltage gain.

Transistors 18, 36 and 44 are all connected in emitter-follower configurations which provide no voltage gain but these transistors do provide current gain. Transistor 34 provides the open loop inverted voltage gain stage. Consequently, circuit 10 is quite stable with a single gain stage and does not require large internal capacitors or any external components for frequency compensation.

COMMON MODE REJECTION

Dotted resistances 53 and 54, respectively, represent the internal impedances of the current supplies including transistors 26 and 28, respectively. Dotted resistances 56 and 58, respectively, represent the internal resistances of the current sinks including transistors 22 and 24, respectively. Dotted resistances 64 and 65, respectively, represent the internal resistances of the input and feedback NPN transistors. Since transistors 26 and 28 are matched, the resistance of resistances 53 and 54 are approximately equal to each other; and since transistors 22 and 24 are matched, the resistance of resistances 56 and 58 are also approximately equal to each other. Also since transistors 18 and 44 are matched, the resistances 64 and 65 are approximately equal to each other.

Current supply transistor 26 has a terminal 59 which is coupled through transistor 36 to output terminal 40 of amplifier circuit. As has been previously explained, during dynamic operation, the voltage at the collector electrode of transistor 34 tends to vary in magnitude. More specifically, the voltage at the collector electrode of transistor 34 differs from the output voltage by only the base-to-emitter voltage across transistor 36. Since the voltage at positive supply conductor 14 has a fixed magnitude and since the voltage at terminal 59 varies, the current through resistance 53 tends to vary and adversely affect the magnitude of the output signal at output terminal 40 of the amplifier circuit. Similarly, current supply transistor 28 has an output terminal 61 which is coupled through transistors 34 and 36 to output terminal 40 of amplifier circuit 10. During dynamic operation, the voltage at terminal 61 also changes which causes an undesired signal through resistance 54 which tends to adversely effect the magnitude of the output signal at output terminal 40 of amplifier circuit 10.

Transistor 34 and diode 38 are included in a signal cancellation circuit 63 which is coupled to terminals 59 of the current supply circuit including transistor 26 and to terminal 61 of the current supply circuit including transistor 28. The undesired signal at terminal 59 tends to increase the drive to output transistor 36 by a predetermined amount while the undesired signal at terminal 61 tends to render transistor 34 more conductive which reduces the drive to transistor 36 by the same predetermined amount. Thus, signal cancellation circuit 63 utilizes the undesired signals from transistors 26 and 28, which are of a similar nature to each other, to cancel each other so that such undesired signals do not adversely affect the magnitude of the output signal at output terminal 40 of amplifier circuit 10.

Transistor 18 is coupled through transistors 34 and 36 to output terminal 40 of amplifier circuit 10. During dynamic operation, transistor 18 creates undesired signals at the emitter electrode of transistor 34 and across resistance 56 of current sink transistor 22 which tend to adversely effect the magnitude of the output signal at output terminal 40 of amplifier circuit 10. Likewise, as the magnitude of the output signal on output terminal 40 changes, feedback transistor 44 tends to cause undesired signals across resistance 58 of current sink transistor 24 and at the cathode of diode 38.

Signal cancellation circuit 63 utilizes these undesired signals of transistors 22 and 24, which are similar to each other, to cancel each other so that these signals do not adversely effect the magnitude of the output signal at output terminal 40 of amplifier circuit 10. For instance, as the input signal increases in magnitude, the emitter voltages of transistors 18 and 44 both tend to increase by the same amount because the magnitude of the output signal at terminal 40 tends to follow the magnitude of the input signal at terminal 12. The increasing voltage at the emitter of transistor 34 tends to render transistor 34 less conductive by a certain amount while the increase in voltage at terminal 52 tends to cause transistor 34 to be more conductive by the same amount. Cconsequently, the conduction of transistor 34 is not changed. The undesirably increasing currents of current sink transistors 22 and 24 are also cancelled by signal cancellation circuit 63.

Resistor 64 and resistor 65 which are associated with input transistor 18 and feedback transistor 44 respectively each produces currents which tend to create undesired signals which adversely affects the magnitude of the output signal at output terminal 40. However signal cancelling circuit 63 also utilizes these undesired signals of transistors 18 and 44 to cancel each other so that these signals do not adversely affect the magnitude of the output signal at output terminal 40. For instance, as the input signal increases in magnitude, the emitter voltage of transistor 18 and 44 both tend to follow the input change as previously described. The increasing voltage at terminal 20 causes a decrease in current through resistor 64 which increases the current in transistor 34 which decreases the drive current to the base of transistor 36. However, the increase in voltage at terminal 52, causes a decrease in current through resistor 65 which increases the current in diode 38 which decreases the drive to transistor 34 which increases the drive to the base of transistor 36. Thus the changing currents associated with transistors 18 and 44 are also cancelled by signal cancellation circuit 63.

What has been described is embodiment 10, a simple, unity gain amplifier suitable for fabrication in monolithic integrated circuit form. The circuit provides high common mode rejection capability and the stable configuration of circuit 10 has a high input impedance.

While the invention has been described in its preferred embodiment, it is to be understood that the words which have been used are words of description rather than limitation and that changes within the purview of the appended claims may be made without departing from the true scope and spirit of the invention in its broader aspects.

I claim:

1. An amplifier circuit for providing an output signal at an output terminal thereof having a magnitude which precisely follows the magnitude of an input signal at an input terminal thereof, including in combination:

first current supply means having predetermined electrical characteristics and at least one terminal, said first current supply means being coupled to the output terminal of the amplifier circuit, said first current supply means causing a first undesired signal which tends to affect the output signal at the output terminal of the amplifier circuit;

second current supply means having electrical characteristics matched to said predetermined electrical characteristics of said first current supply means and at least one terminal, said second current supply means being coupled to the output terminal of the amplifier circuit, said second current supply means causing a second undesired signal having substantially the same magnitude as the first undesired signal which tends to affect the magnitude of the output signal at the output terminal of the amplifier circuit; and signal cancellation circuit means having a current mirror means which responds to a current at a first terminal thereof to provide another current of substantially the same magnitude at a second terminal thereof, said first terminal of said current mirror means being coupled to said terminal of said first current supply means and said second terminal of said current mirror means being coupled to said terminal of said second current supply means, said current mirror means utilizing said first and second undesired signals of the same magnitude to cancel each other so that said first and second undesired signals do not adversely affect the output signal at the output terminal of the amplifier circuit.

2. The amplifier circuit of claim 1 further including output electron control means coupled between said signal cancellation circuit means and the output terminal of the amplifier circuit.

3. The amplifier circuit of claim 1 further including feedback electron control means connected between the output terminal of the amplifier circuit and said signal cancellation circuit means.

4. The amplifier circuit of claim 1 further including in combination:

first electron control means having at least a control electrode and an output electrode, said first electron control means being coupled to the output terminal of the amplifier circuit, said first electron control means causing a third undesired signal which tends to effect the output signal at the output terminal of the amplifier circuit;

second electron control means having at least a control electrode and an output electrode, said second electron control means being coupled to the output terminal of the amplifier circuit, said second electron control means causing a fourth undesired signal which tends to effect the output signal at the output terminal of the amplifier circuit; and said current mirror means of said signal cancellation circuit further having a third terminal and a fourth terminal, said third terminal being coupled to said output electrode of said first electron control means, said fourth terminal being coupled to said output electrode of said second electron control means, said current mirror means utilizing said third and fourth undesired signals to cancel each other so that said third and fourth undesired signals do not adversely effect the output signal at the output terminal of the amplifier circuit.

5. The amplifier circuit of claim 4 further including in combination:

first current sink means having at least one terminal, said first current sink means being coupled to said output terminal of the amplifier circuit, said first current sink means causing a fifth undesired signal which tends to effect the output signal at the output terminal of the amplifier circuit;

second current sink means having at least one terminal, said second current sink means being coupled to the output terminal of the amplifier circuit, said second current sink means causing a sixth undesired signal which tends to effect the output signal at the output terminal of the amplifier circuit; and said third terminal of said current mirror means of said signal cancellation circuit being coupled to said terminal of said first current sink means and said fourth terminal of said current mirror means being coupled to said terminal of said second current sink means, said cancellation circuit means utilizing said fifth and sixth undesired signals to cancel each other so that said fifth and sixth undesired signals do not adversely affect the output signal at the output terminal of the amplifier circuit.

6. A unity gain amplifier circuit having a high degree of common mode rejection for providing an output signal at an output terminal thereof having a magnitude which substantially equals and precisely follows the magnitude of an input signal at an input terminal thereof, including in combination:

first current supply means having at least one terminal, said first current supply means being coupled to the output terminal of the amplifier circuit, said first current supply means causing a first undesired signal which tends to adversely effect the magnitude of the output signal at the output terminal of the amplifier circuit;

second current supply means having at least one terminal, said second current supply means being coupled to the output terminal of the amplifier circuit, said second current supply means causing a second undesired signal which tends to adversely effect the magnitude of the output signal at the output terminal of the amplifier circuit;

first electron control means having at least a control electrode and an output electrode, said first electron control means being coupled to the output terminal of the amplifier circuit, said first electron control means causing a third undesired signal which tends to adversely effect the magnitude of the output signal at the output terminal of the amplifier circuit;

second electron control means having at least a control electrode and an output electrode, said second electron control means being coupled to the output terminal of the amplifier circuit, said second electron control means causing a fourth undesired signal which tends to adversely effect the magnitude of the output signal at the output terminal of the amplifier circuit; and signal cancellation circuit means having a current mirror means with a first terminal coupled to said terminal of said first current supply means, a second terminal coupled to said terminal of said second current supply means, a third terminal coupled to said output electrode of said first electron control means, and a fourth terminal coupled to said output electrode of said second electron control means, said signal cancellation circuit means utilizing said first and second undesired signals to cancel each other and said third and fourth undesired signals to cancel each other so that said undesired signals do not adversely effect the magnitude of the output signal at the output terminal of the amplifier circuit.

7. The amplifier circuit of claim 6 wherein:

said first electron control means includes a bipolar transistor having base and emitter electrodes respectively corresponding to said control and output electrodes; and said second electron control means includes a bipolar transistor having base and emitter electrodes, respectively, corresponding to said control and output electrodes thereof.

8. The amplifier circuit of claim 6 wherein said current mirror means includes a bipolar transistor and a diode connected to said bipolar transistor.

9. The amplifier circuit of claim 6 further including in combination:

first current sink means having at least one terminal, said first current sink means being coupled to said output terminal of the amplifier circuit, said first current sink means causing a fifth undesired signal which tends to adversely effect the magnitude of the output signal at the output terminal of the amplifier circuit;

second current sink means having at least one terminal, said second current sink means being coupled to the output terminal of the amplifier circuit, said second current sink means causing a sixth undesired signal which tends to adversely effect the magnitude of the output signal at the output terminal of the amplifier circuit; and said third terminal of said current mirror means of said signal cancellation circuit being coupled to said terminal of said first current sink means and said fourth terminal of said current mirror means being coupled to said terminal of said second current sink means, said cancellation circuit means utilizing said fifth and sixth undesired signals to cancel each other so that said fifth and sixth undesired signals do not effect the magnitude of the output signal at the output terminal of the amplifier circuit.

10. The amplifier circuit of claim 6 further including an output transistor coupled between said first terminal of said current mirror means and the output terminal of the amplifier circuit.

* * * * *